(12) United States Patent
Tsai et al.

(10) Patent No.: US 11,251,028 B2
(45) Date of Patent: Feb. 15, 2022

(54) PRE-CLEAN CHAMBER WITH INTEGRATED SHUTTER GARAGE

(71) Applicant: APPLIED MATERIALS, INC., Santa Clara, CA (US)

(72) Inventors: Cheng-Hsiung Matt Tsai, Cupertino, CA (US); Ananthkrishna Jupudi, Singapore (SG); Sarath Babu, Singapore (SG); Manjunatha P. Koppa, Bengaluru (IN); Hiroyuki Takahama, Chiba-Ken (JP)

(73) Assignee: APPLIED MATERIALS, INC., Santa Clara, CA (US)

( * ) Notice: Subject to any disclaimer, the term of this patent is extended or adjusted under 35 U.S.C. 154(b) by 20 days.

(21) Appl. No.: 16/405,070

(22) Filed: May 7, 2019

(65) Prior Publication Data
US 2019/0348264 A1 Nov. 14, 2019

Related U.S. Application Data

(60) Provisional application No. 62/670,749, filed on May 12, 2018.

(51) Int. Cl.
*H01L 21/67* (2006.01)
*H01L 21/68* (2006.01)
(Continued)

(52) U.S. Cl.
CPC ........ *H01J 37/3447* (2013.01); *C23C 14/021* (2013.01); *H01L 21/6719* (2013.01);
(Continued)

(58) Field of Classification Search
CPC ........... H01L 21/67196; H01L 21/6719; H01L 21/68; H01L 21/68707; H01L 21/67766
See application file for complete search history.

(56) References Cited

U.S. PATENT DOCUMENTS

| 5,358,615 A | 10/1994 | Grant et al. |
| 6,045,670 A | 4/2000 | Adams et al. |

(Continued)

FOREIGN PATENT DOCUMENTS

WO  WO 2006/113170 A2  10/2006

OTHER PUBLICATIONS

International Search Report for PCT/US2019/031100, dated Aug. 19, 2019.

(Continued)

*Primary Examiner* — Binu Thomas
(74) *Attorney, Agent, or Firm* — Moser Taboada

(57) ABSTRACT

Substrate processing chambers with integrated shutter garage are provided herein. In some embodiments, a pre-clean substrate processing chamber may include a chamber body, wherein the chamber body includes a first side configured to be attached to mainframe substrate processing tool, and a second side disposed opposite the first side, a substrate support configured to support a substrate when disposed thereon, a shutter disk garage disposed on the second side of the process chamber, and a shutter disk assembly mechanism comprising a rotatable shaft, and a robot shutter arm coupled to the shaft, wherein the robot shutter arm includes a shutter disk assembly support section configured to support a shutter disk assembly, and wherein the shutter disk assembly mechanism is configured to move the robot shutter arm between a storage position within the shutter garage and a processing position within the process chamber over the substrate support.

17 Claims, 4 Drawing Sheets

(51) Int. Cl.
*H01J 37/34* (2006.01)
*C23C 14/02* (2006.01)
*H01L 21/687* (2006.01)
*H01L 21/677* (2006.01)

(52) U.S. Cl.
CPC .. *H01L 21/67028* (2013.01); *H01L 21/67196* (2013.01); *H01L 21/67766* (2013.01); *H01L 21/68* (2013.01); *H01L 21/68707* (2013.01); *H01J 2237/335* (2013.01); *H01L 21/68785* (2013.01)

(56) References Cited

U.S. PATENT DOCUMENTS

| | | | |
|---|---|---|---|
| 6,098,637 A * | 8/2000 | Parke | C23C 16/4405 118/50.1 |
| 6,824,627 B2 | 11/2004 | Dhindsa et al. | |
| 8,211,324 B2 | 7/2012 | Dhindsa et al. | |
| 9,252,002 B2 | 2/2016 | Cheng-Hsiung et al. | |
| 11,043,406 B2 * | 6/2021 | Tsai | H01L 21/68785 |
| 2004/0089536 A1 | 5/2004 | Feltsman et al. | |
| 2004/0182698 A1 * | 9/2004 | Feltsman | C23C 14/566 204/298.11 |
| 2004/0245098 A1 | 12/2004 | Eckerson | |
| 2006/0156979 A1 * | 7/2006 | Thakur | H01L 21/6719 118/715 |
| 2007/0032081 A1 | 2/2007 | Chang et al. | |
| 2009/0130336 A1 | 5/2009 | Dekempeneer et al. | |
| 2009/0142512 A1 | 6/2009 | Forster et al. | |
| 2009/0173446 A1 | 7/2009 | Yang et al. | |
| 2010/0071625 A1 | 3/2010 | Brown | |
| 2010/0326818 A1 | 12/2010 | Ikemoto et al. | |
| 2011/0126984 A1 | 6/2011 | Kang et al. | |
| 2012/0103793 A1 | 5/2012 | Fujii | |
| 2014/0020629 A1 * | 1/2014 | Tsai | H01J 37/3447 118/728 |
| 2014/0271081 A1 * | 9/2014 | Lavitsky | H01L 21/67103 414/744.2 |
| 2019/0326154 A1 * | 10/2019 | Tsai | H01L 21/68785 |

OTHER PUBLICATIONS

International Search Report and Written Opinion dated Sep. 25, 2013 for PCT Application No. PCT/US2013/050490.
U.S. Appl. No. 16/383,772, filed Apr. 15, 2019.

* cited by examiner

PRE-CLEAN CHAMBER WITH INTEGRATED SHUTTER GARAGE

CROSS-REFERENCE TO RELATED APPLICATIONS

This application claims benefit of U.S. provisional patent application Ser. No. 62/670,749, filed May 12, 2018 which is herein incorporated by reference in its entirety.

FIELD

Embodiments of the present disclosure generally relate to the field of substrate process chambers, and more specifically to pre-clean chambers with integrated shutter garages.

BACKGROUND

Conventional semiconductor device formation is commonly performed in one or more process chambers which have the capability to process substrates (e.g., semiconductor wafers) in a controlled processing environment. To maintain process uniformity and ensure optimal performance of the process chamber, various conditioning operations are periodically performed. For example, in a physical vapor deposition (PVD) process chamber, one commonly used conditioning operation is a "burn-in" process, wherein a target disposed in the PVD process chamber is bombarded with plasma ions to remove oxides or other contaminants from the target prior to performing substrate processes. Another commonly used conditioning operation is a "pasting" process, wherein a covering is applied over material deposited on process chamber surfaces to prevent the material from flaking off the process chamber surfaces and contaminating the substrate during subsequent processes. Another operation is a "preclean" operation. In-situ removal of organic residues and native oxide using a preclean process in a preclean chamber ensures a clean surface that promotes low contact resistance and excellent adhesion.

In all of the aforementioned conditioning/preclean operations, a shutter disk may be positioned via a transfer robot atop a substrate support disposed in the process chamber to prevent the deposition of any materials upon the substrate support. The shutter disk typically comprises a material having a mechanical stiffness sufficient enough to resist deformation due to the additional weight of the deposited material. For example, the shutter disk commonly comprises a metal alloy, such as stainless steel, or a ceramic, such as silicon carbide.

However, the inventors have observed that during a conditioning and preclean processes, the shutter disk heats up. Due to heat gradient and/or deposition on the disc, the shutter disk may develop stresses from a thermal mismatch between the top and bottom surfaces of the shutter disk, for example, causing the shutter disk to deform (e.g., bow up at the ends). This warping/deformation creates a gap which results in plasma exposure to the substrate support through the gap. Metal deposition on the substrate support could lead to substrate wafer arcing, substrate wafer sticking and/or breaking, electrostatic chucking force reduction if the substrate support is an electrostatic chuck, etc.

In addition, shutter disks are often stored clear of the processing area and moved by buffer chamber robots into a desired position during use. In order for the robots to be able to handle the disks, the weight and thickness of shutter disks must be minimized. These lighter weight/lower thickness shutter disks deform more during the pasting and burn-in processes.

Various solution have been tried to address the aforementioned problems. For example, use of lower RF powers, longer cooling periods, and addition of a cooling gas to the backside of a shutter disk have been tried. However, the inventors have observed that none of these solutions sufficiently protected the substrate support from undesired material deposition.

Accordingly, improved two-piece shutter disk assemblies are provided herein.

SUMMARY

Substrate processing chambers with integrated shutter garage are provided herein. In some embodiments, a pre-clean substrate processing chamber may include a chamber body, wherein the chamber body includes a first side configured to be attached to mainframe substrate processing tool, and a second side disposed opposite the first side, a substrate support configured to support a substrate when disposed thereon, a shutter disk garage disposed on the second side of the process chamber, and a shutter disk assembly mechanism comprising a rotatable shaft, and a robot shutter arm coupled to the shaft, wherein the robot shutter arm includes a shutter disk assembly support section configured to support a shutter disk assembly, and wherein the shutter disk assembly mechanism is configured to move the robot shutter arm between a storage position within the shutter garage and a processing position within the process chamber over the substrate support.

Other embodiments and variations of the present disclosure are disclosed in greater detail below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure generally relate to an integrated shutter garage and shutter arm assembly for moving shutter disk assemblies for use in substrate process chambers, such as, for example, semiconductor manufacturing process chambers, and to substrate process chambers incorporating such shutter disk assemblies. In some embodiments, the inventive apparatus includes an integrated shutter garage and shutter arm assembly on a pre-clean chamber. The inventive apparatus may advantageously reduce interference with other chambers by its placement on the back of the process chamber. In addition, embodiments of the present disclosure advantageously can improve kit life, controls defects, improve throughput, and prevent cross contamination through the use of an integrated shutter garage disposed on the back of the process chamber, and associated shutter disk assembly, for use in pre-clean and other substrate processing operations.

Figure 1:
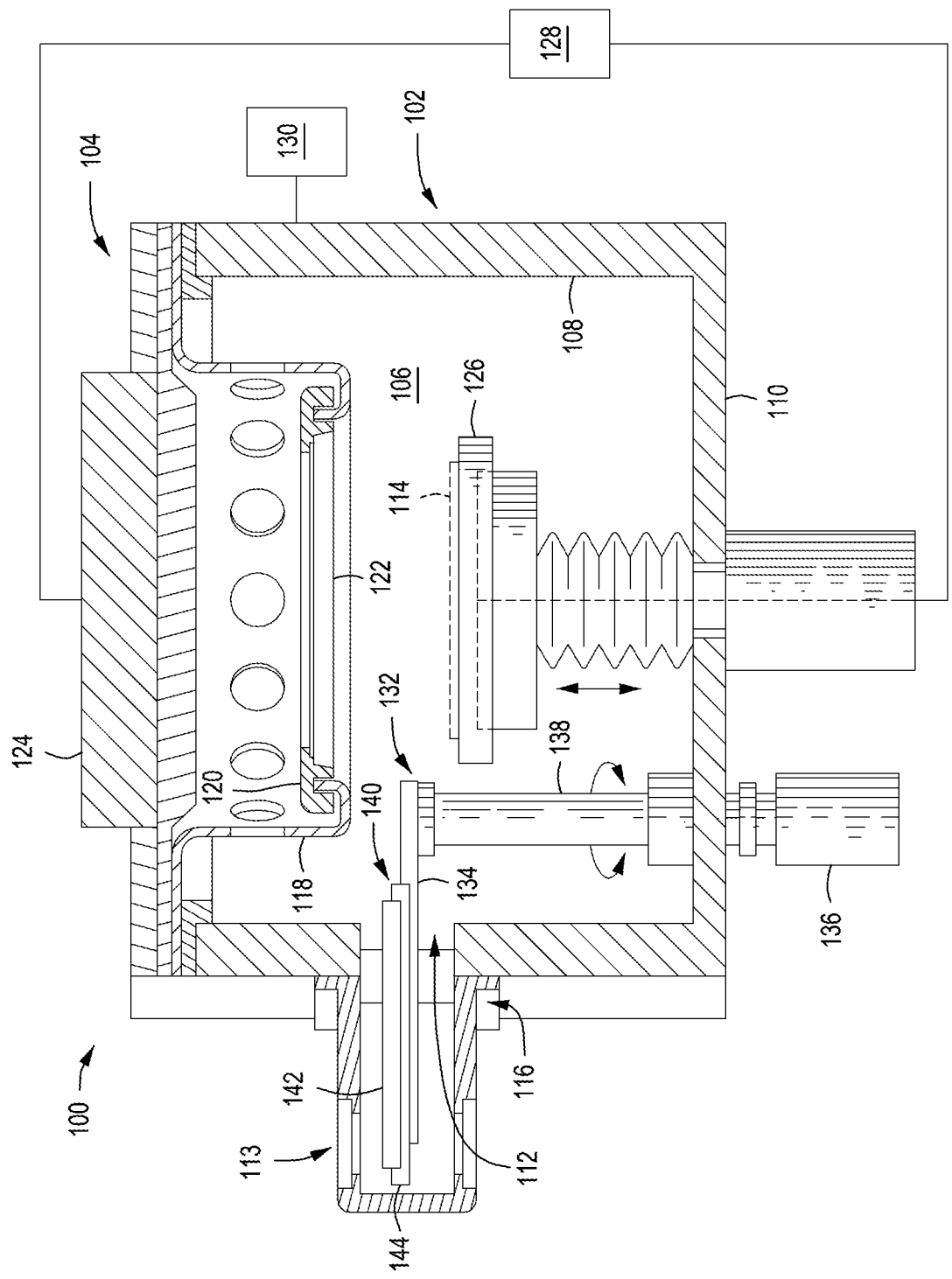
FIG. 1 is a schematic diagram of an exemplary process chamber suitable for use in accordance with some embodiments of the present disclosure.

FIG. 1 is a schematic diagram of an exemplary process chamber 100 for use in connection with some embodiments of the present disclosure. In some embodiments, the process chamber 100 may be one of a plurality of chambers combined to form a multi-chamber processing system (e.g., a cluster tool). Alternatively, the process chamber 100 may be a standalone process chamber. In some embodiments, the process chamber 100 may be a deposition chamber, for example, a physical vapor deposition (PVD) chamber. Alternatively, the process chamber 100 may be any suitable process chamber in which a shutter disk assembly may be used to protect the substrate support from damage during chamber cleaning and or seasoning processes.

The process chamber 100 includes a chamber body 102 and a lid assembly 104 that defines an evacuable process volume 106. The chamber body 102 generally includes one or more sidewalls 108 and a bottom 110. The one or more sidewalls 108 may be a single circular sidewall or multiple sidewalls in process chambers having non-circular configurations. The sidewalls generally contain a shutter disk assembly port 112. In some embodiments, a shutter garage 113 located outside of process chamber 100 may store the shutter disk assembly 140 and move it into process chamber 100 through shutter disk assembly port 112 in process chamber 100. A housing 116 generally covers the shutter disk assembly port 112 to maintain the integrity of the vacuum within the process volume 106. Additional ports may be provided in the sidewalls, such as a sealable access port to provide for the entrance and egress of the substrate 114 from the process chamber 100. A pumping port may be provided in the sidewalls and/or the bottom of the chamber body 102 and is coupled to a pumping system that evacuates and controls the pressure within the process volume 106.

The lid assembly 104 of the chamber body 102 generally supports an annular shield 118 that supports a shadow ring 120. The shadow ring 120 is generally configured to confine deposition to a portion of the substrate 114 exposed through the center of the shadow ring 120. The lid assembly 104 generally comprises a target 122 and a magnetron 124.

The target 122 provides material that is deposited on the substrate 114 during the deposition process while the magnetron 124 enhances uniform consumption of the target material during processing. The target 122 and substrate support 126 are biased relative each other by a power source 128. An inert gas, for example, argon, is supplied to the process volume 106 from a gas source 130. A plasma is formed between the substrate 114 and the target 122 from the gas. Ions within the plasma are accelerated toward the target 122 and cause material to become dislodged from the target 122. The dislodged target material is attracted towards the substrate 114 and deposits a film of material thereon.

The substrate support 126 is generally disposed on the bottom 110 of the chamber body 102 and supports the substrate 114 during processing. A shutter disk assembly mechanism 132 is generally disposed proximate the substrate support 126. The shutter disk assembly mechanism 132 generally includes a robot shutter arm 134 that supports the shutter disk assembly 140 and an actuator 136 coupled to the robot shutter arm 134 by a shaft 138 to control the position of the robot shutter arm 134. The robot shutter arm 134 may be moved between the retracted, or cleared position shown in FIG. 1 and a second position that places the shutter disk assembly 140 directly over and substantially concentric with the substrate support 126. The actuator 136 may be any device that may be adapted to rotate the shaft 138 through an angle that moves the robot shutter arm 134 between the cleared and second positions.

In some embodiments, the shutter disk assembly 140 comprises an upper disk member 142 and a lower carrier member 144. Although described herein as a two-piece assembly, the shutter disk assembly may include additional components. In addition, although described herein as a disk, the shutter disk assembly and its components may have any suitable geometry for protecting a substrate support within a particular process chamber. In some embodiments, the upper disk member 142 may be a target itself and used for pasting processes. The lower carrier member 144 forms an electrically insulated barrier around the upper disk member 142 target. This allows for pasting process using the upper disk member 142 as a target while preventing arcing to the substrate support. The lower carrier member 144 and the upper disk member 142 are movably disposed or coupled with respect to each other such that the lower carrier member 144 and the upper disk member 142 may move in relation to each, for example, to allow for independent thermal expansion and contraction of the components. In some embodiments, the upper disk member 142 may merely rest upon the lower carrier member 144.

Figure 5:
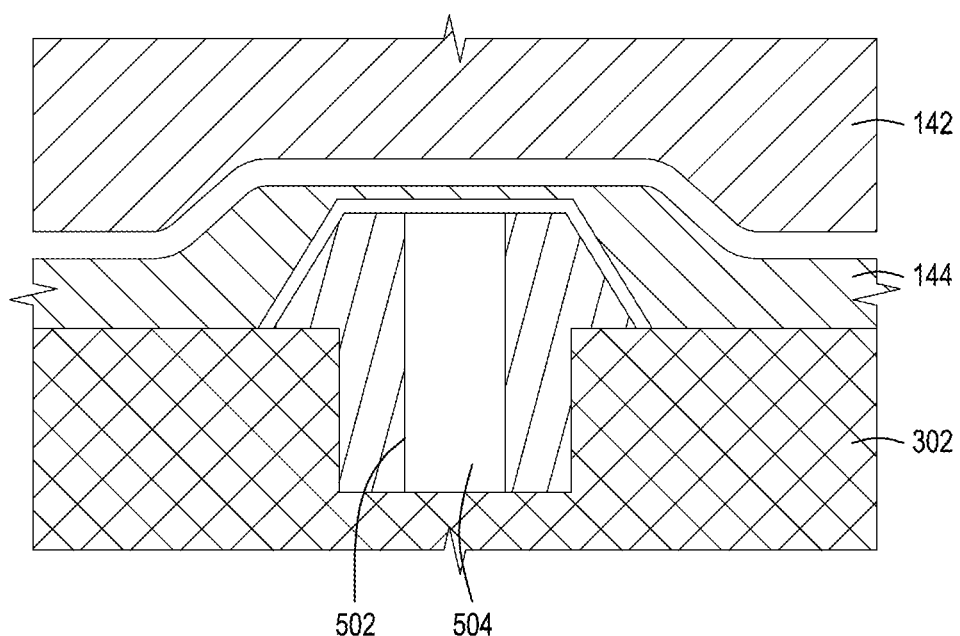
FIG. 5 depicts a cross-sectional of the self-centering features of the shutter disk assembly in accordance with some embodiments of the present disclosure.

In some embodiments, a first central self-centering feature 500 as shown in FIG. 5 forms shutter disk assembly. In some embodiments, an alignment plug 502 is disposed in cavity 506 formed in robot shutter arm 134 and fits into the cavity formed in the bottom surface of carrier member 144 to self-align the entire shutter disk assembly 140 on the robot shutter arm 134. The alignment plug 502 may be cone-shaped as shown, or may have other geometric shapes to facilitate alignment. In some embodiments, the alignment plug 502 includes an opening 504 formed through the center of the alignment plug 502 for weight reduction or reduce the inertia when it's moving. In some embodiments, the alignment plug 502 may be formed as part of the robot shutter arm 134, or as a separate piece as shown in FIG. 5. In some embodiments, the alignment plug 502 is made of the same material as the robot shutter arm 134, or may be made of, or coated with, an electrically insulative material. As shown in FIG. 5, the central self-alignment assembly 500 aligns the upper disk member 142, the carrier member 144 and the robot shutter arm 134 which includes gaps between each alignment feature to allow the upper disk member 142 to radially move or deform with respect to lower carrier member 144, and the lower carrier member 144 to move with respect to and the robot shutter arm 134 for example, due to thermal expansion and contraction.

Figure 2:
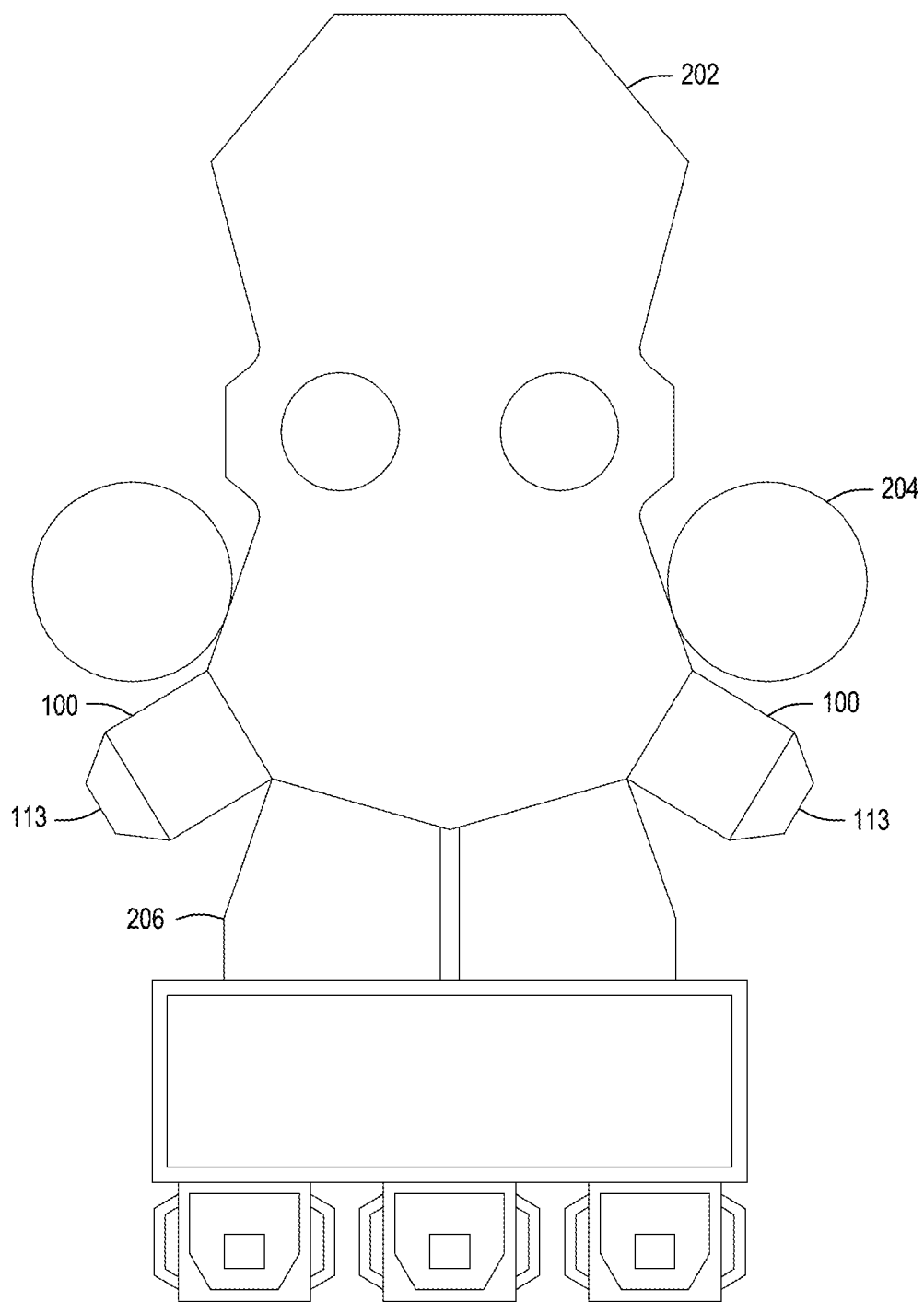
FIG. 2 is a top down view of a mainframe tool for substrate processing with a plurality of substrate processing chambers coupled to the mainframe in accordance with some embodiments of the present disclosure.

As shown in FIG. 2, the shutter garage 113 is disposed on the back of the process chamber 101 which advantageously reduces interference with other chambers 204. This allows process chamber 101 to be attached to the mainframe 202 without interfering with chambers 204 or the load/unload modules 206. In typical PVD chamber, the shutter garage was disposed on the side of the process chamber 101 due to the weight of the shutter disk assembly 140 which required a heavy and bigger robot shutter arm. By using the lighter weight robot shutter arm 134 and shutter disk assembly 140, the shutter garage 113 could be positioned in the rear of the process chamber.

Figure 3:
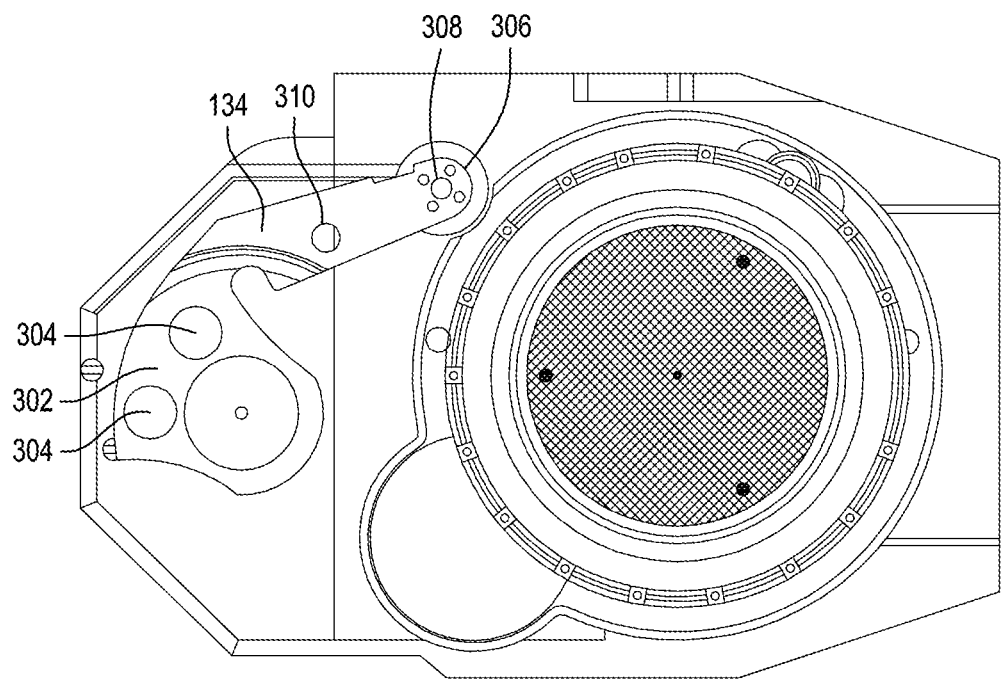
FIG. 3 is a top down cross-sectional view of a shutter garage and process chamber in accordance with some embodiments of the present disclosure.
Figure 4:
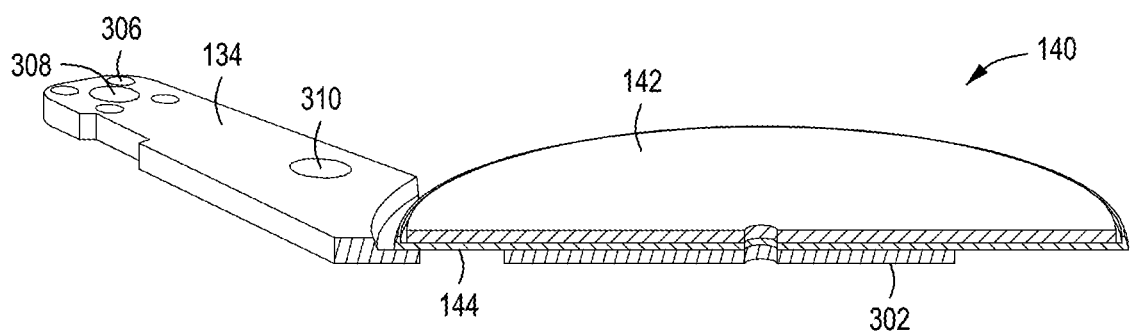
FIG. 4 depicts a cross-sectional perspective view of the exemplary shutter disk assembly on a robot arm mechanism in accordance with some embodiments of the present disclosure.

FIG. 3 depicts a top down cross-sectional view of the shutter garage, robot shutter arm 134, and the process chamber 100. As shown in FIG. 3, the robot shutter arm 134 includes a shutter disk assembly support section 302, which supports the shutter disk assembly 140. The shutter disk assembly support section 302 includes one or more weight reduction holes 304. The shutter disk assembly support section 302 may also include a cavity 506 and/or alignment plug 502 as part of the central self-alignment assembly 500 described above to facilitate alignment of the upper disk member 142, the carrier member 144 and the robot shutter arm 134 as shown in FIG. 4. In some embodiments, the robot shutter arm 134 also include one or more arm holes 310 which for weight reduction and/or alignment purposes. The robot shutter arm 134 includes a plurality of mounting holes/bolts 306 for mounting the robot shutter arm 134 to shaft 138. The robot shutter arm 134 pivots about the central axis shaft 308.

In some embodiments, the shape of the robot shutter arm 134 is such that it is designed to reduce weight, and therefore inertia during movement. For example, as shown in FIG. 3, the robot shutter arm 134 not only include weight reduction holes 304/310, but further includes the minimum surface area to support the shutter disk assembly 140 with bending. In some embodiments, the surface area of the shutter disk assembly support section 302 is between about 15% to about 50% of the surface area of the bottom surface of the shutter disk assembly 140. In some embodiments, the surface area of the shutter disk assembly support section 302 is between about 15% to about 35% of the surface area of the bottom surface of the shutter disk assembly 140.

FIG. 3 depicts the robot shutter arm 134 in storage position within the shutter garage 113. The robot shutter arm 134 rotates about central axis shaft 308 to move the robot shutter arm 134 and the shutter disk assembly 140 it carries over substrate 114 so that the shutter disk assembly 140 covers the substrate 114.

While the foregoing is directed to embodiments of the present disclosure, other and further embodiments of the disclosure may be devised without departing from the basic scope thereof, and the scope thereof is determined by the claims that follow.

The invention claimed is:

1. A pre-clean substrate processing chamber, comprising:
a chamber body, wherein the chamber body includes a first side configured to be attached to mainframe substrate processing tool, and a second side disposed opposite the first side;
a substrate support configured to support a substrate when disposed thereon;
a shutter disk garage disposed on the second side of the process chamber, wherein the substrate processing chamber includes one or more sidewalls, and wherein one of the one or more sidewalls includes a shutter disk assembly port, and wherein the chamber body includes a first side configured to be attached to a mainframe substrate processing tool, and a second side disposed opposite the first side, and wherein the shutter garage is attached an outside surface of the second side of the process chamber; and
a shutter disk assembly comprising:
an upper disk member having a top surface and a bottom surface, wherein a central alignment recess is formed in a center of the bottom surface; and
a lower carrier member having a solid base having an upper support surface, wherein the upper support surface includes a first central self-centering feature disposed in the central alignment recess formed in the center of the bottom surface of the upper disk member, and wherein the upper disk member is supported by the lower carrier member;
a shutter disk assembly mechanism comprising:
a rotatable shaft; and
a robot shutter arm coupled to the shaft, wherein the robot shutter arm includes a shutter disk assembly support section configured to support the shutter disk assembly when disposed thereon, and wherein the shutter disk assembly mechanism is configured to move the robot shutter arm between a storage position within the shutter garage and a processing position within the process chamber over the substrate support.

2. A substrate processing chamber, comprising:
a chamber body;
a substrate support configured to support a substrate when disposed thereon;
a shutter disk garage attached an outside surface of the process chamber, wherein the substrate processing chamber includes one or more sidewalls, and wherein one of the one or more sidewalls includes a shutter disk assembly port, and wherein the chamber body includes a first side configured to be attached to a mainframe substrate processing tool, and a second side disposed opposite the first side, and wherein the shutter garage is attached an outside surface of the second side of the process chamber;
a shutter disk assembly comprising:
an upper disk member having a top surface and a bottom surface, wherein a central alignment recess is formed in a center of the bottom surface; and
a lower carrier member having a solid base having an upper support surface, wherein the upper support surface includes a first central self-centering feature disposed in the central alignment recess formed in the center of the bottom surface of the upper disk member, and wherein the upper disk member is supported by the lower carrier member; and
a shutter disk assembly mechanism comprising:
a rotatable shaft;
a robot shutter arm coupled to the shaft, wherein the robot shutter arm includes a shutter disk assembly support section configured to support the shutter disk assembly, and wherein the shutter disk assembly mechanism is configured to move the robot shutter arm between a storage position within the shutter garage and a processing position within the process chamber over the substrate support; and
a central self-alignment assembly including a first cavity formed in a bottom surface of the shutter disk assembly, and an alignment feature disposed on a top surface of the robot shutter arm that is disposed in the first cavity formed in the bottom surface of the shutter disk assembly.

3. The substrate processing chamber of claim 2, wherein the robot shutter arm includes a shutter disk assembly support section that supports the shutter disk assembly, and wherein the alignment feature is formed in the top surface of the shutter disk assembly support section.

4. The substrate processing chamber of claim 3, wherein the alignment feature consists of a second cavity formed in the robot shutter arm and an alignment plug having a first end disposed in the first cavity of the shutter disk assembly, and a second end disposed in the second cavity formed in the robot shutter arm.

5. The substrate processing chamber of claim 4, wherein the first end of the alignment plug is cone-shaped.

6. The substrate processing chamber of claim 4, wherein the alignment plug includes an opening formed through the center of the alignment plug for weight reduction and to reduce inertia when moving.

7. The substrate processing chamber of claim 4, wherein the alignment plug is made of the same material as the robot shutter arm.

8. The substrate processing chamber of claim 4, wherein the alignment plug is made of, or coated with, an electrically insulative material.

9. The substrate processing chamber of claim 2, wherein the substrate processing chamber is one of a plurality of chambers combined to form a multi-chamber cluster tool.

10. The substrate processing chamber of claim 2, wherein the substrate processing chamber is configured to perform pre-cleaning and/or seasoning processes.

11. The substrate processing chamber of claim 2, wherein the shutter disk assembly mechanism is configured to move the robot shutter arm and shutter disk assembly between the storage position within the shutter garage and the processing position within the process chamber through the shutter disk assembly port.

12. The substrate processing chamber of claim 2, wherein the shutter disk assembly port is covered by a housing configured to maintain a vacuum within a process volume of the substrate processing chamber.

13. The substrate processing chamber of claim 2, wherein the shutter disk assembly mechanism further includes an actuator coupled to the robot shutter which is configured to control the position of the robot shutter arm.

14. The substrate processing chamber of claim 2, wherein the robot shutter arm includes a shutter disk assembly support section configured to support the shutter disk assembly when disposed thereon.

15. The substrate processing chamber of claim 14, wherein the robot shutter arm includes one or more weight reduction holes and one or more alignment holes.

16. The substrate processing chamber of claim 14, wherein a surface area of a top surface of the shutter disk assembly support section is between about 15% to about 35% of the surface area of a bottom surface of the shutter disk assembly.

17. The substrate processing chamber of claim 14, wherein shutter disk assembly support section includes a cavity formed in the robot shutter arm and an alignment plug disposed in the cavity and configured to align the shutter disk assembly and the robot shutter arm.

* * * * *